United States Patent [19]

Svedberg

[11] Patent Number: 4,694,315
[45] Date of Patent: Sep. 15, 1987

[54] CMOS OVERVOLTAGE PROTECTION CIRCUIT UTILIZING THYRISTOR AND MAJORITY CARRIER INJECTING ANTI-PARALLEL DIODE

[75] Inventor: Per Svedberg, Vällingby, Sweden

[73] Assignee: ASEA Aktiebolag, Västerås, Sweden

[21] Appl. No.: 832,786

[22] Filed: Feb. 26, 1986

[30] Foreign Application Priority Data

Feb. 26, 1985 [SE] Sweden ................................ 8500924

[51] Int. Cl.$^4$ .......................................... H01L 29/78
[52] U.S. Cl. .................................. 357/23.13; 357/13; 357/38; 357/42; 307/318; 307/639; 361/56; 361/91
[58] Field of Search ................... 357/23.13, 13, 38, 42; 307/252 J, 252 N, 318; 361/56, 91

[56] References Cited

U.S. PATENT DOCUMENTS

| | | | |
|---|---|---|---|
| 3,475,653 | 10/1969 | Odenberg et al. | 307/252 J |
| 3,573,550 | 4/1971 | Baker | 307/318 |
| 4,131,908 | 12/1978 | Daub et al. | 357/23.13 |
| 4,356,502 | 10/1982 | Yamada | 357/13 |
| 4,476,476 | 10/1984 | Yu et al. | 357/42 |
| 4,484,244 | 11/1984 | Avery | 361/56 |
| 4,567,500 | 1/1986 | Avery | 361/56 |
| 4,633,283 | 12/1986 | Avery | 357/23.13 |

Primary Examiner—Joseph E. Clawson, Jr.
Attorney, Agent, or Firm—Pollock, Vande Sande & Priddy

[57] ABSTRACT

A semiconductor device comprises a semiconductor circuit of CMOS type and an overvoltage protective circuit integrated therewith. The CMOS circuit and the overvoltage protective circuit are formed in one and the same substrate. The device has a contact electrically connected to the substrate. The CMOS circuit has a plurality of inputs. Between each input and the contact connected to the substrate, there is formed and connected in antiparallel a thyristor and a diode. Each thyristor has a firing circuit for ignition of the thyristor at a voltage level which is internally predetermined by the overvoltage protective circuit. In this way, an overvoltage occurring between an arbitrary pair of inputs will cause ignition of the thyristors of the overvoltage protective circuit and short-circuit of the inputs, which efficiently protects the CMOS circuit against overvoltages.

12 Claims, 10 Drawing Figures

CMOS OVERVOLTAGE PROTECTION CIRCUIT UTILIZING THYRISTOR AND MAJORITY CARRIER INJECTING ANTI-PARALLEL DIODE

TECHNICAL FIELD

The present invention relates to a semiconductor device, comprising an integrated CMOS-type semiconductor circuit which has a substrate and a contact electrically connected to the substrate as well as at least two inputs.

PRIOR ART

Integrated CMOS-type semiconductor circuits are already well known and are widely used. Such a circuit comprises a plurality of complementary field effect transistor circuits, in which the field effect transistors are of MOS type. Such a circuit operates at low voltage levels—a few volts—and is easily destroyed by even relatively small overvoltages. Such overvoltages may arise for many reasons and are fed to the circuit via conductors connected to the inputs of the circuit. The term "input" is defined here, and in the following description, as not just one of the connections of the circuit used for the supply of an input signal to the circuit, but also the connections for the emission of an output signal from the circuit.

Overvoltages of the kind mentioned above may in certain cases assume relatively high levels; and one object of the invention is to provide a semiconductor device in which the CMOS semiconductor circuit included is efficiently protected against the occurrence of any damaging overvoltages. An efficient overvoltage protective circuit is especially important for those applications in which a very high reliability in operation is required, for example medical and industrial electronics.

In certain situations, very severe size limits are imposed on semiconductor devices to be included in an apparatus. A further object of the invention is therefore to provide a semiconductor device which includes an efficient overvoltage protective circuit and which meets the small size requirements imposed.

In Svedberg U.S. Pat. No. 4,282,555 an overvoltage protective means is described which comprises a number of branches, each branch consisting of a thyristor and a diode connected in anti-parallel with the thyristor. The protective circuit described in U.S. Pat. No. 4,282,555 constitutes a separate unit for connection to the inputs of the circuit or component which is to be protected. The prior art protective circuit has its own enclosure and will in certain cases require an unacceptably large space.

In Johansson U.S. Pat. No. 4,439,802, an overvoltage protective means for electronic circuits is described. Between each input and one of the supply connections to the circuit there is an anti-parallel connection of a thyristor and a diode. The potential of each input is limited by the circuit to a value which cannot exceed the potential of the positive supply connection and which cannot be lower than the potential of the negative supply connection. The protective level is therefore limited by the supply connections. This is an essential disadvantage, since it is often desirable, or necessary, to limit overvoltages to a level other than the level determined by the supply connections. This U.S. Pat. No. 4,439,802 mentions the possibility of arranging for the protective circuit to be integrated with the circuit to be protected. However, such an integration would normally cause serious disturbances in the operation of the protected circuit due to the heavy charge carrier injection which would derive from the thyristors of the overvoltage protective means each time the protective means entered into operation.

A further object of the invention is to provide an overvoltage protective means for a CMOS circuit, which has the highest possible reliability, does not disturb the operation of the CMOS circuit, and has a level of protection which is adjustable independently of the supply voltages.

SUMMARY OF THE INVENTION

According to the invention, an overvoltage protective circuit is made in the same substrate as the semiconductor circuit, and is thus integrated therewith. For each one of the inputs of the semiconductor circuit, the protective circuit comprises an anti-parallel connection of a thyristor and a diode, connected between the input and the substrate contact. Each thyristor has a firing circuit which senses the voltage across the thyristor and ignites the thyristor at a predetermined voltage level. Because of their ability to handle high currents with a low voltage drop, the thyristors and the diodes provide an extremely efficient protection against incoming overvoltages, as will be further described hereafter. Since the protective circuit is integrated with the actual semiconductor circuit, the increase of the volume and space requirement of the device—caused by the protective circuit—will at most be small and at best none at all.

It is well-known per se that the operation of a CMOS circuit can be easily disturbed by undesired charge carriers appearing in the semiconductor body. Because of their powerful injection of charge carriers, to integrate thyristors of an overvoltage protective means with a CMOS circuit involves a high risk that such a disturbance will occur. According to a preferred embodiment of the invention, the overvoltage protective circuit is, therefore, arranged laterally separated from the integrated CMOS semiconductor circuit and separated from it by a zone for reduction of the concentration of minority charge carriers occurring in the substrate. Such a zone preferably consists of a region with a conduction type opposite to that of the substrate and arranged at one surface of the substrate. The region may be unconnected or alternatively it may be provided with a contact for connection to a voltage source with such a polarity that the PN junction arising between the region and the substrate is biassed in the reverse direction. In this way, the concentration of minority charge carriers occurring in the substrate portion of the overvoltage protective circuit can be efficiently reduced to a level which is acceptable and harmless to the adjacent CMOS circuit.

It has been found that an especially efficient reduction of the minority charge carrier concentration can be obtained if the above-mentioned region is made of a conduction type opposite to that of the substrate and is divided into a plurality of separate and unconnected sub-regions.

It is of great importance that the activation voltage of the overvoltage protective circuit be well-defined. According to a preferred embodiment of the invention, this can be obtained by arranging a zener diode junction, which blocks the thyristor voltage, between, for example, the anode and P-base layer of the thryristor.

According to an alternative embodiment of the invention, a MOS transistor portion instead is arranged in the same way between, for example, the anode and P-base of the thyristor. By a suitable choice of doping level of the layers included or—in case of a MOS transistor—a suitable embodiment of the geometry, the firing voltage and hence the operating voltage of the thyristor can be set with high accuracy.

BRIEF DESCRIPTION OF THE DRAWINGS

The invention will now be described in greater detail, by way of example, with reference to the accompanying drawings, wherein:

FIG. 5b is a circuit diagram illustrating the principle behind the embodiment according to FIG. 5a.

DESCRIPTION OF PREFERRED EMBODIMENTS

Figure 1:
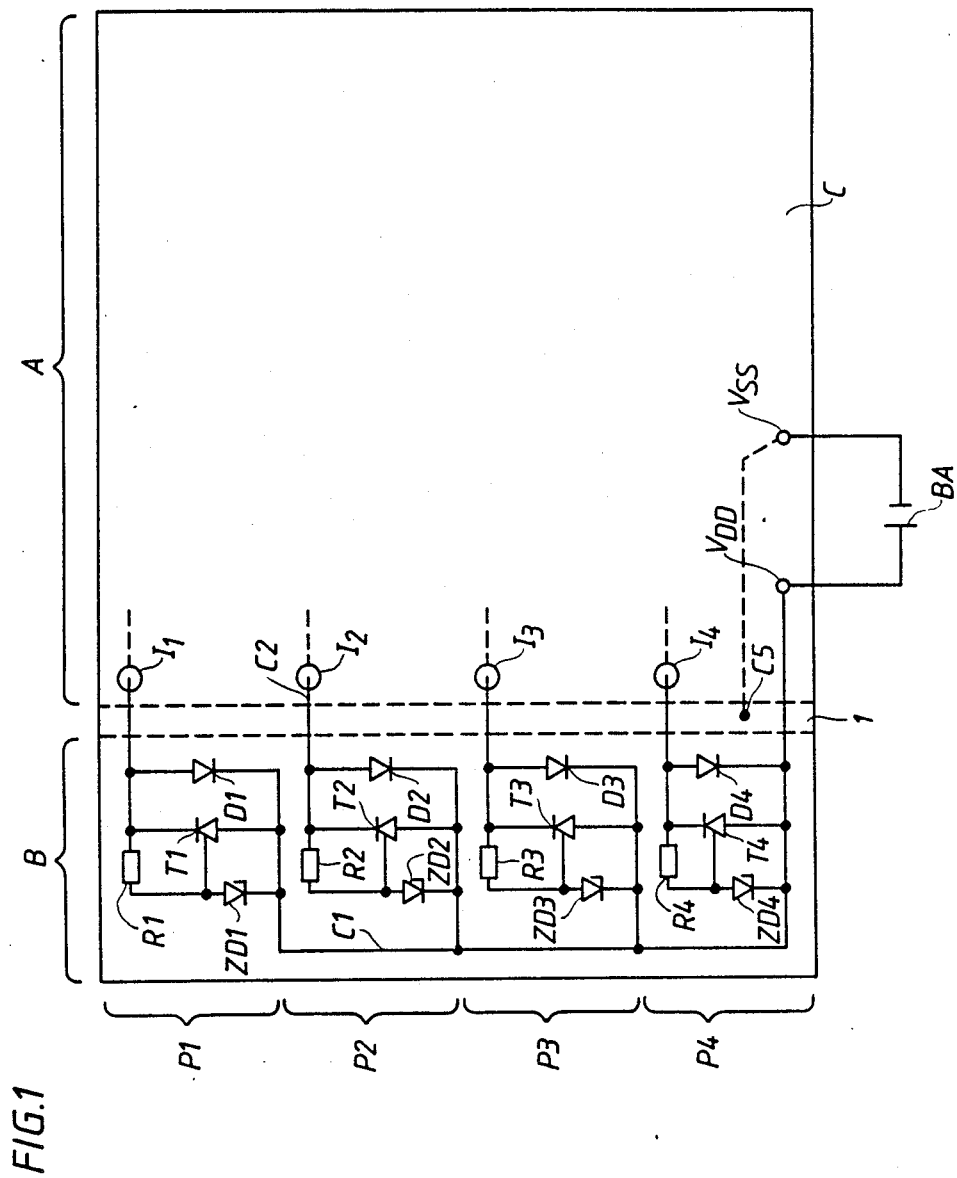
FIG. 1 shows purely schematically how a CMOS circuit and an overvoltage protective circuit can be arranged one one semiconductor body in a device according to the invention.

FIG. 1 shows schematically part of one embodiment of an integrated semiconductor device according to the invention. On a substrate C (e.g. an N-doped silicon wafer) of a size, for example, of 2 mm by 3 mm, there are formed a CMOS circuit A and an overvoltage protective circuit B therefor. The circuits A and B are laterally separated by a protective zone 1, which prevents charge carriers from the circuit B disturbing the proper functioning of the CMOS circuit A. The device has connections $V_{DD}$ and $V_{SS}$ for connection to a supply voltage source BA with a voltage of, for example 2 V. The connection $V_{DD}$ is connected to the substrate C and to a contact C1 in circuit B. The connection $V_{SS}$ may, as will be described in greater detail hereafter, be connected to a connection C5 located in the protective zone 1. Only the four inputs $I_1$, $I_2$, $I_3$ and $I_4$ of the CMOS circuit A are shown in FIG. 1. These inputs would be connected to conductors for supplying input signals to, or for delivering output signals from, the CMOS circuit, but for convenience these conductors are not shown in FIG. 1.

The overvoltage protective circuit B shown in FIG. 1 comprises four sub-circuits P1–P4, one for each input of the CMOS circuit. The sub-circuits are mutually identical and each of them is connected between a respective input and the common contact C1. Thus, for example the circuit P1 includes an anti-parallel connection of a diode D1 and a thyristor T1. To ensure that the thyristor is ignited at a predetermined voltage level, a zener diode ZD1 is connected between the anode of the thyristor and its control terminal. A resistance R1 is provided between the control terminal and the cathode of the thyristor. The components included in the overvoltage protective circuit B have been shown as discrete components in FIG. 1, but as will be made clear hereafter they can be integrated with the CMOS circuit A, that is, made by planar techniques in the same substrate (C) as the CMOS circuit.

The mode of operation of the protective circuit B is as follows. If an externally originating overvoltage arises, for example between the inputs $I_1$ and $I_2$ and with $I_1$ positive in relation to $I_2$, the diode D1 will conduct and lock the input $I_1$ to the potential $V_{DD}$ of the contact C1. If the amplitude of the overvoltage exceeds the activation voltage of the protective means, which in this case is determined by the breakdown voltage of the zener diode ZD2, the zener diode will carry current in its reverse directon and by virtue of the resistance R2 it will generate a positive control voltage on the control terminal of the thyristor, which results in the thyristor T2 being fired. When the thyristor T2 is conducting, a low voltage drop exists there across, which means that the overvoltage protective means has efficiently short-circuited the two inputs $I_1$ and $I_2$ and efficiently prevented the overvoltage from spreading into the CMOS circuit A and thus causing damage thereto.

A similar mode of operation of the overvoltage protective circuit B as described above occurs in the case of overvoltages between an arbitrary pair of inputs and with an arbitrary polarity. By a suitable choice of the breakdown voltages of the zener diodes, the activation voltage of the protective circuit may be set at a suitable value.

Figure 2A:
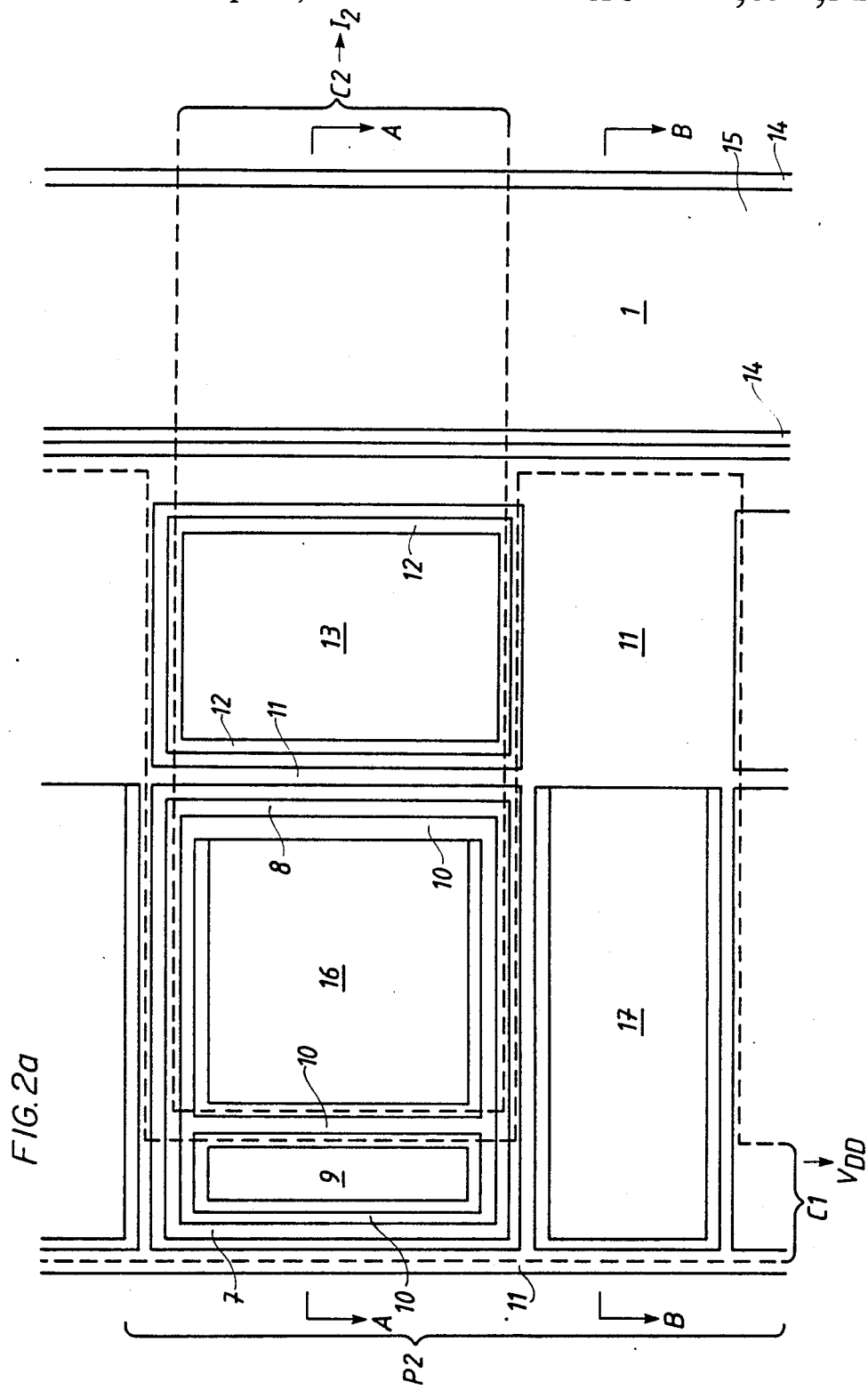
FIG. 2a shows an enlarged plan view of one possible embodiment of that part of the protective circuit which belongs to one of the inputs of the CMOS circuit.
Figure 2B:
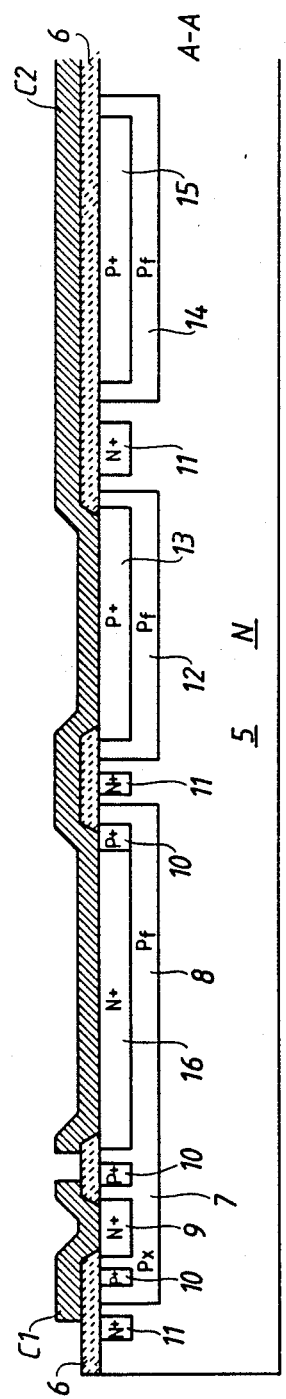
FIGS. 2b and 2c are sections on the lines A-A and B-B of FIG. 2a, FIG. 3a shows an alternative embodiment of the invention, in which the firing circuit of the thyristor comprises two series-connected zener diodes for increased freedom in choosing the level of the operating voltage.
Figure 2C:
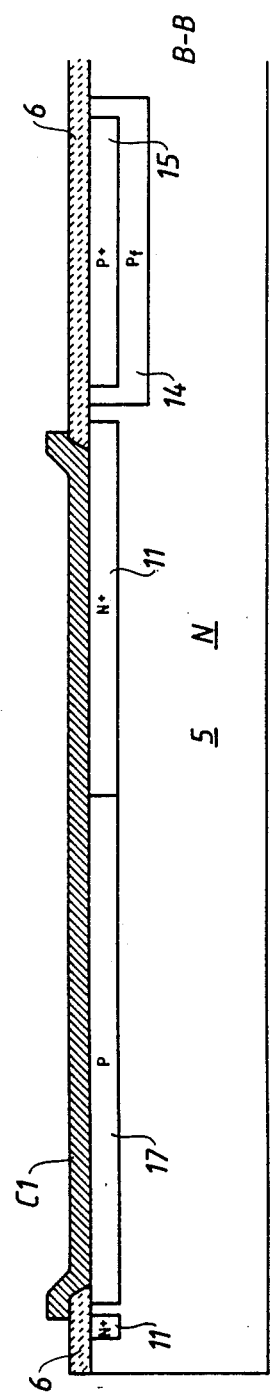

FIG. 2a shows the sub-circuit P2 of the device of FIG. 1 in greater detail and as deposit areas on a silicon wafer, FIG. 2b shows a section on the line A—A of FIG. 2a and FIG. 2c shows a section on the line B—B.

The protective zone 1 is shown at the extreme right in FIGS. 2a and 2b. To the left thereof, in the upper part of FIG. 2a, can be seen first an anode layer 13 of the diode D2, then a cathode layer 16 of the thyristor T2, and finally a cathode layer 9 of the zener diode ZD2. Adjacent to these layers, and below them as shown in FIG. 2a, is an anode layer 17 of the thyristor T2 and an N+-doped layer 11 for connecting the contact C1 to the substrate 5. The contact C2, which is shown with dashed boundaries in FIG. 2a, makes contact with the layers 13 and 16 and with the part of layer 10 which is on the right-hand side in FIG. 2a. The contact C1, which is also shown with dashed boundaries in FIG. 2a, makes contact with the layers 9, 17 and 11.

The substrate 5 is N-conducting with an impurity concentration in the range of $10^{15}-10^{16}$ cm$^{-3}$. P-conducting pockets 7-8, 12 and 14 are formed in the substrate. These pockets are P-conducting and have a degree of doping designated $P_f$ which at the surface is, for example, $3 \times 10^{16}$ cm$^{-3}$ and which diminishes downwards towards the junction to the substrate 5. An exception from this rule is the doping of the part 7 of the P-pocket 7-8 which is designated $P_x$, and which is chosen in order to give the zener diode ZD2 a suitable breakdown voltage and may be in the range of $10^{16} - 10^{18}$ cm$^{-3}$. In the pocket 14 a P+-conducting band 15 is formed, which in the same way as the other P+-conducting regions has an impurity concentration in the range of $10^{18} - 10^{20}$ cm$^{-3}$. The band 14-15 forms the protective zone 1 shown in FIG. 1 and this zone extends completely across the entire substrate and operates in a manner which will be described hereafter.

Within the pocket 12 a P+-conducting layer 13 is formed, which constitutes the anode of the diode D2 whose cathode is provided by the substrate 5.

In the right-hand side of the pocket 7-8, an N+-conducting layer 16 is formed, which constitutes the cathode of the thyristor T2. The P-base layer of the thyristor consists of the pocket 8, its N-base layer is provided by the substrate 5 and its anode layer is provided by the P-conducting layer 17 shown in FIGS. 2a and 2c. The P+-conducting layer 10 formed in the pocket 7-8 surrounds the layer 16 but is spaced therefrom except over that part of the layer 16 shown on the right-hand side in FIGS. 2a and 2b, where the layer 10 directly adjoins the layer 16. In the layer 7 at the left-hand side of the pocket 7-8 the N+-conducting layer 9 is formed, which provides the cathode for the zener diode ZD2.

In FIG. 2c the P-conducting anode layer 17 of the thyristor T2 is shown and this can be seen to abut the N+-conducting layer 11.

On the surface of the substrate a silicon dioxide layer 6 is provided, on which the contact C1 and a contact C2 are applied and which is provided with openings providing access to the underlying layers.

In operation of the thyristor T2, minority charge carriers (holes) will be injected in the substrate 5 and will tend to move to the right in FIGS. 2a and 2b towards the CMOS circuit A. The holes which arrive in the vicinity of the protective zone 1 tend to move to the junction between the substrate 5 and the layer 14. In this layer, which has a low degree of doping, the degree of recombination for holes is high. This means that the majority of the holes which arrive in the vicinity of the protective zone 1 will be drawn into the protective zone and will there be lost by being filled with electrons. This results in the concentration of minority charge carriers being reduced to a low level acceptable to the CMOS circuit A.

When the breakdown voltage of the zener diode ZD2 has been exceeded, a current flows from the contact C1 via the layers 9, 7 and 8 to the layer 10 and the contact C2. This current flows in the layer 8 and in the parts of the layer 10 which are disposed on either side of the layer 16. The resistance of this current path is the resistance designated R2 in FIG. 1 and gives rise to a voltage drop which renders the parts of the layer which are shown on the left-hand side in FIGS. 2a and 2b sufficiently positive in order for an injection from the layer 16 to take place and for the thyristor T2 to ignite.

As shown in FIG. 1, the protective zone 1 may be provided with a contact C5, which is connected to the supply connection V$_{SS}$. This contact is not shown in FIGS. 2a, 2b or 2c. In this alternative embodiment, the layers 14 and 15 are kept at a potential which is negative relative to the potential of the substrate 5. In this way an electric field is obtained in the vicinity of the junction between the substrate and the layer 14, which field efficiently transports the holes to the layer 14 where they are lost by recombination.

Figure 3A:
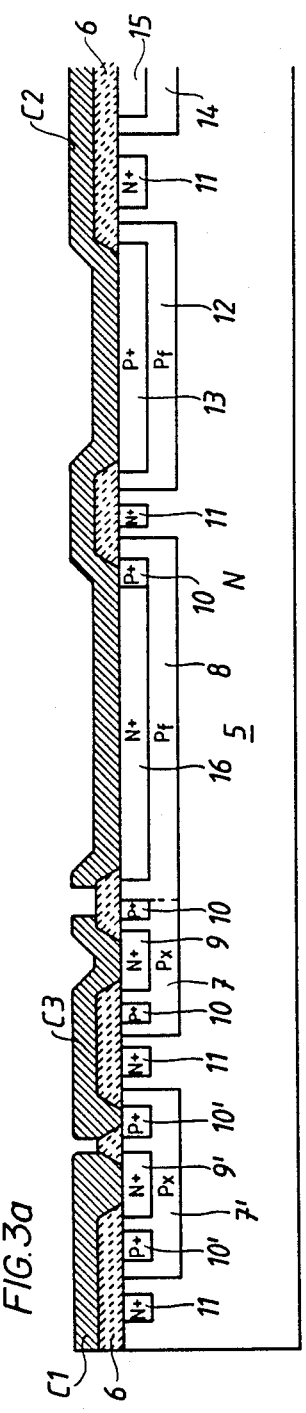
FIG. 3b is a circuit diagram illustrating the principle behind the embodiment according to FIG. 3a, FIGS. 4a and 4b show, in plan and section views respectively, on the line C—C, how the protective zone between the overvoltage protective circuit and the CMOS circuit of the device of FIG. 1 can be formed with a large number of separate and unconnected regions of a conduction type opposite to that of the substrate.
Figure 3B:
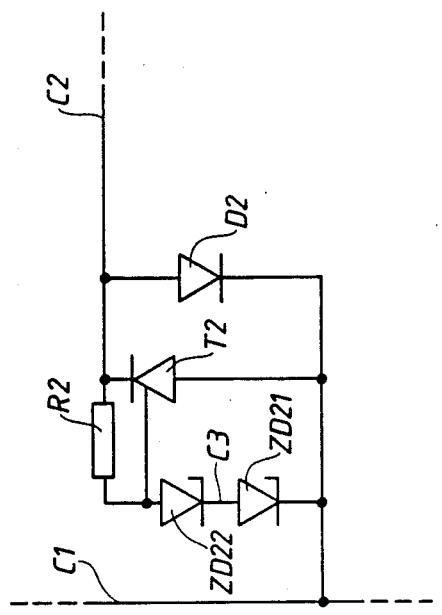

The overvoltage protective circuit of a device according to the inventio may be fabricated simultaneously with and using the same process steps as the actual CMOS circuit, which is a considerable advantage from the point of view of cost and ease of manufacture. In this connection it has been found that, in order to obtain greater freedom in the choice of the operating voltage of the overvoltage protective means, the zener diode ZD2 can be replaced by two or more series-connected zener diodes. FIG. 3b shows how, according to this embodiment of the invention, two series-connected zener diodes ZD21 and ZD22 can be provided. The diode ZD21 is formed (see FIG. 3a) by the junction between an N+-doped layer 9' arranged in a P-pocket 7', which layer 9' is surrounded by a spaced-apart P+-conducting layer 10'. The contact C1 is connected to the layer 9'. The anode of the zener diode ZD21, which consists of the layer 7', is connected via the layer 10' and a contact C3 to the cathode layer 9 of the zener diode ZD22. The latter is formed in exactly the same way as the zener diode ZD2 shown in FIG. 2b.

Figure 4A:
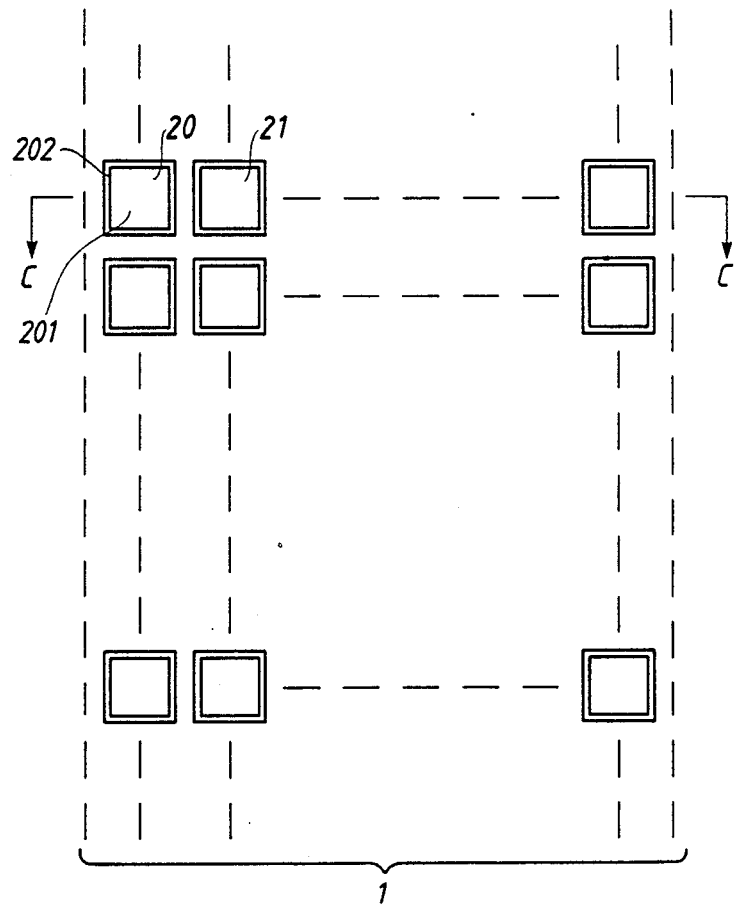
Figure 4B:
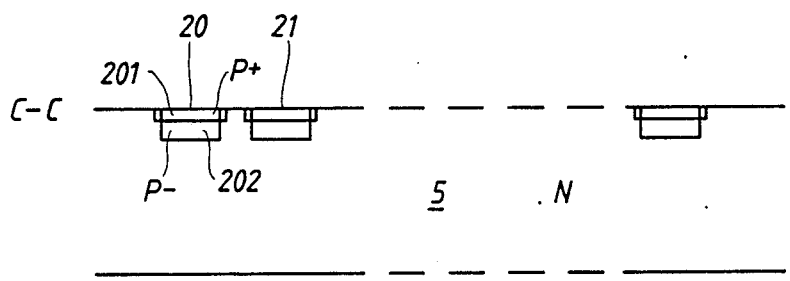

The protective zone 1 (layers 14 and 15) described above is shown as a coherent band, which may have a width of, for example, 350 μm. It has been found that a specially efficient interception and recombination of minority charge carriers can be obtained if the protective zone is made in the form of a band of a large number of uncontacted P-doped islands which are separated from each other. FIGS. 4a and 4b show an example of this embodiment. In the protective zone 1, which may have the width mentioned above, a large number of P-doped islands 20, 21 are formed. Of these only a few are shown in FIGS. 4a and 4b. The islands may, for example be square with a side of 20 μm and with a distance of, for example, 15 μm between adjacent islands. FIG. 4b shows how, for example, the island 20 is formed with a slightly P-conducting layer 202 and a P+-conducting layer 201 surrounding the layer 202 closest to the surface of the substrate.

Figure 5A:
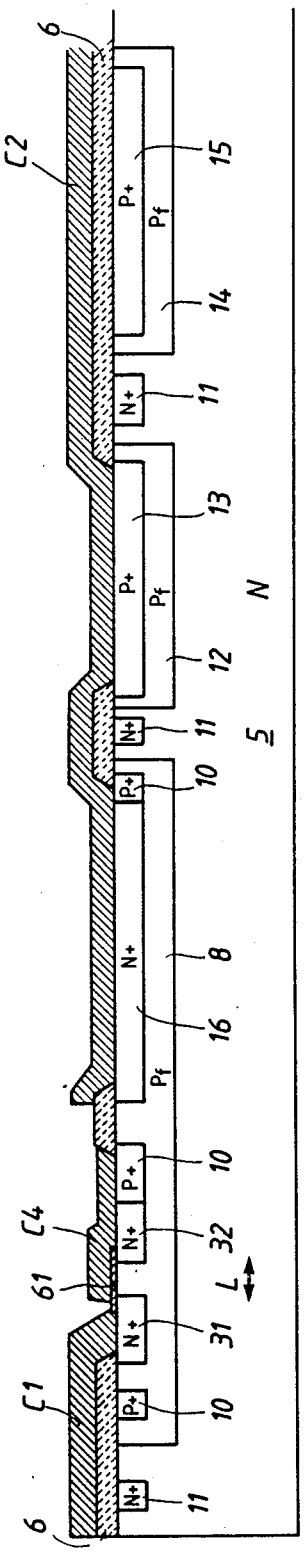
FIG. 5a shows an alternative embodiment in which, instead of one or more zener diodes, the firing circuit of the thyristor includes a MOS transistor as a voltage-determining element.
Figure 5B:
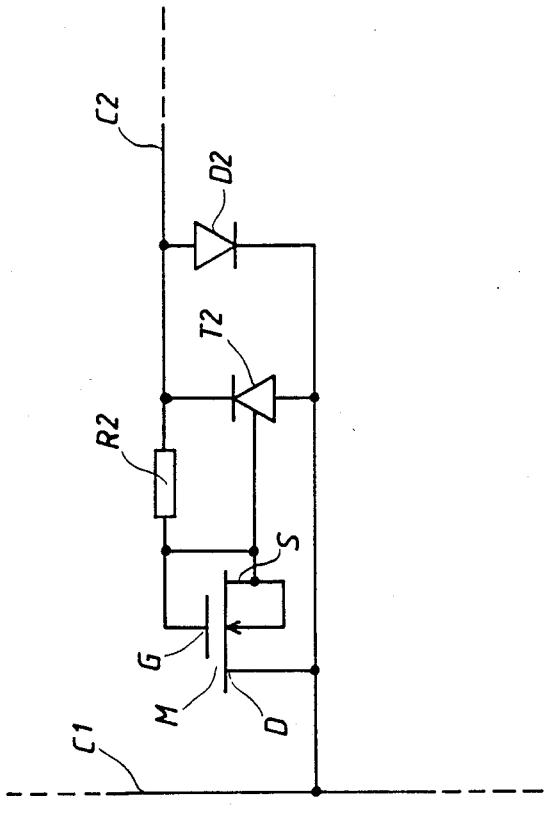

In the foregoing it has been described how the voltage-determining element, arranged in the firing circuit of the thyristor, consists of a zener diode or of several series-connected zener diodes. According to one alternative embodiment of the invention, instead of a zener diode, a MOS structure (e.g. a so-called MOS diode), may be used as the voltage-determining element. FIGS. 5a and 5b show one example of such an embodiment. FIG. 5b shows how a MOS diode M is connected in the control circuit of the thyristor T2. The MOS diode M is formed as a conventional MOS transistor and with its control gate G connected to the source-electrode S of the transistor. The other main electrode D (the drain electrode) of the MOS transistor is connected to the contact C1. The electrode S is connected to the control terminal of the thyristor T2 and, via the resistance R2, to the cathode of the thyristor T2.

The MOS structure can be formed in the pocket 8, in the manner shown in FIG. 5a. It consists of two N+-conducting layers 31 and 32, between which, a channel connecting the two layers is formed close to the surface of the substrate 5. The contact C1 is connected to the layer 31. A metal contact C4 is connected to the layer 32 and extends over the channel region where it is arranged on top of a thin insulating layer 61 and operates as the control electrode for the MOS structure. When the voltage across the MOS structure becomes so high its breakdown voltage is reached, current starts flowing from the layer 31 to the layer 32 and from the latter, via the contact C4 and the layer 10, to the layer 8 which is the control layer of the thyristor. In the same way as previously described, ignition of the thyristor of the overvoltage protective circuit is thus obtained before a damaging overvoltage can arise.

If the MOS structure shown in FIG. 5a is designed in the same way as the MOS transistors included in the actual CMOS circuit A, the MOS structure will have approximately the same breakdown voltage as the transistors of the CMOS circuit. For the overvoltage protective circuit B to provide efficient protection, it is suitable for the breakdown voltage of the MOS structure to be lower than the breakdown voltage of the transistors of the CMOS circuit. This can be achieved in several different possible ways. One way of reaching this effect is to make the channel length L of the MOS structure in FIG. 5a smaller than the channel length in the transistors of the CMOS circuit. Another way is to dope the channel region of the MOS structure in the overvoltage protective means more strongly than the corresponding channel regions of the transistors of the CMOS circuit. A third way is to give the MOS structure such a geometrical shape that, at the desired operating voltage, the depletion layer from one main electrode reaches the depletion layer from the other main electrode and penetration occurs.

The embodiments described above are only examples, and a large number of other embodiments are feasible within the scope of the invention. Thus, for example, the protective zone 1 arranged between the overvoltage protective circuit B and the actual CMOS circuit A can be formed as a zone with a low minority charge carrier life. Such a zone can be obtained, in a manner known per se, by irradiation with electrons or ions or by doping with a substance forming recomination centers, for example gold. Similarly, the firing circuit of the thyristor can be designed in ways different from those described above to give the desired function, namely, ignition of the thyristor at a predetermined and suitably chosen level of the voltage across the thyristor. Possibly, the firing circuit may be omitted and the thyristor be formed so that its breakover voltage becomes so low that the thyristor is self-ignited at a forward blocking voltage which is lower than the maximum permissible voltage of the CMOS circuit.

These and other modifications are to be understood as falling within the spirit and scope of the invention as defined in the following claims.

I claim:

1. A semiconductor device comprising:
    a CMOS type semiconductor circuit having a substrate, a contact electrically connected to the substrate and at least two inputs;
    an overvoltage protective circuit formed in the substrate, the overvoltage protective circuit providing for each input an antiparallel array of a thyristor and a diode, the array being connected between the respective input and the contact, each thyristor being turned on at a voltage level predetermined internally by the overvoltage protective circuit; each thyristor having in succession a first emitter layer, a first base layer, a second base layer and a second emitter layer, the substrate constituting one of the base layers; each diode having an anode contact and a cathode contact, one of the contacts electrically communicating with the substrate and injecting thereto charge carriers of the same type as the majority charge carriers in the substrate when current flows through the diode; the CMOS circuit and the overvoltage protective circuit being arranged adjacent to each other in the substrate; and
    a zone formed in the substrate for separating the CMOS circuit and the overvoltage protective circuit, the zone having means for reducing the concentration of minority charge carriers in the substrate.

2. A semiconductor device according to claim 1, wherein the contact electrically communicating with the substrate comprises:
    a base part with fingers extending therefrom and with input contacts connected to the at least two inputs, each input contact having a part situated between two of the fingers, and antiparallel array having a thyristor and a diode being formed in the substrate below and between each of the input contact parts and each of the two fingers adjacent to the part.

3. A semiconductor device according to claim 1, in which said zone a region, provided at a surface of the substrate, said region having a conduction type opposite to the conductivity type of the substrate.

4. A semiconductor device according to claim 3, in which said region is provided with a contact for connection to a voltage source with such a polarity that a PN junction created between the region and the substrate is biased in the reverse direction.

5. A semiconductor device according to claim 3, in which said region is divided into a plurality of separate sub-regions.

6. A semiconductor device according to claim 1, in which each thyristor has a firing circuit adapted to turn the thyristor on at a predetermined voltage level.

7. A semiconductor device according to claim 6, in which the firing circuit of each thyristor comprises a zener diode junction connected to a first emitter layer of the thyristor and to a base layer adjoining its other emitter layer.

8. A semiconductor device according to claim 6, in which the firing circuit of each thyristor comprises a MOS transistor unit connected to a first emitter layer of the thyristor and to a base layer adjoining its other emitter layer.

9. A semiconductor device according to claim 8, in which a control gate of the MOS transistor is connected to one of the main electrodes of the transistor.

10. A semicoductor device according to claim 3, in which said region is formed by doping the substrate with a substance forming recombination centers.

11. A semiconductor device according to claim 5, in which each sub-region is a P-doped area surrounded by N-doped material.

12. A semiconductor device according to claim 11, in which each sub-region comprises a slightly P-conducting layer surrounded, on the surface of the substrate, with a P+-conducting layer.

* * * * *